(12) United States Patent
Cohen (10) Patent No.: US 7,355,253 B2
(45) Date of Patent: Apr. 8, 2008

(54) STRAINED-CHANNEL FIN FIELD EFFECT TRANSISTOR (FET) WITH A UNIFORM CHANNEL THICKNESS AND SEPARATE GATES

(75) Inventor: Guy Moshe Cohen, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/645,646

(22) Filed: Aug. 22, 2003

(65) Prior Publication Data

US 2005/0040444 A1 Feb. 24, 2005

(51) Int. Cl.
*H01L 23/62* (2006.01)
(52) U.S. Cl. .............. 257/365; 257/330; 257/368; 257/E27.06; 257/E29.04
(58) Field of Classification Search ............. 257/347, 257/902–903, 330, 331–332, 365, 368, E51.006, 257/E27.06, E29.04
See application file for complete search history.

(56) References Cited

U.S. PATENT DOCUMENTS

| | | | |
|---|---|---|---|
| 6,413,802 B1 | 7/2002 | Hu et al. | |
| 6,583,496 B2 | 6/2003 | Galtie et al. | |
| 6,593,625 B2 | 7/2003 | Christiansen et al. | |
| 6,794,718 B2 * | 9/2004 | Nowak et al. | 257/347 |
| 6,800,910 B2 | 10/2004 | Lin et al. | |
| 6,909,186 B2 * | 6/2005 | Chu | 257/751 |
| 6,911,383 B2 * | 6/2005 | Doris et al. | 438/588 |
| 6,921,982 B2 * | 7/2005 | Joshi et al. | 257/349 |
| 2003/0127646 A1 | 7/2003 | Christiansen et al. | |
| 2003/0178677 A1 * | 9/2003 | Clark et al. | 257/347 |

FOREIGN PATENT DOCUMENTS

| | | |
|---|---|---|
| EP | 001519420 A2 * | 3/2005 |
| JP | 2001-217430 | 8/2001 |
| JP | 2002-057329 | 2/2002 |
| JP | 2002-198538 | 7/2002 |
| JP | 2004-128185 | 4/2004 |

OTHER PUBLICATIONS

K. Rim, J.L. Hoyt, J.F. Gibbons, "Fabrication and Analysis of Deep Submicron Strained-Si N-MOSFET's", IEEE Trans. Electron Devices, 47(7), p. 1406-1415, Jul. 2000.
Yang-Kyu Choi, Tsu-Jae King, Chenming Hu, "Spacer FinFET: nanoscale double-gate CMOS technology for the terabit era", Solid-State Electronics, 46, pp. 1595-1601, 2002.
K. Rim, J.L. Hoyt, J.F. Gibbons, "Fabrication and Analysis of Deep Submicron Strained-Si N-MOSFET's", IEEE Trans. Electron Devices, 47(7), p. 1406-1415.
P.M. Mooney, "Strain Relaxation and Dislocations in SiGe/Si Structures", Materials Science & Engineering, R Reports: A Review Journal, Continuation of Materials Science Reports, vol. R17, No. 3, pp. 105-146, (1996).

* cited by examiner

*Primary Examiner*—Thanhha S. Pham
(74) *Attorney, Agent, or Firm*—McGinn IP Law Group, PLLC; Anne V. Dougherty, Esq.

(57) ABSTRACT

A semiconductor device (and method for making the same) includes a strained-silicon channel formed adjacent a source and a drain, a first gate formed over a first side of the channel, a second gate formed over a second side of the channel, a first gate dielectric formed between the first gate and the strained-silicon channel, and a second gate dielectric formed between the second gate and the strained-silicon channel. The strained-silicon channel is non-planar.

28 Claims, 13 Drawing Sheets

STRAINED-CHANNEL FIN FIELD EFFECT TRANSISTOR (FET) WITH A UNIFORM CHANNEL THICKNESS AND SEPARATE GATES

BACKGROUND OF THE INVENTION

1. Field of the Invention

The present invention relates to a semiconductor device, and more particularly to a Fin Field Effect Transistor (Fin-FET) with a strained channel and electrically separate gates that are independently controllable, and to a method of forming the FinFET device.

2. Description of the Related Art

FinFETs are considered promising candidates for complementary metal oxide semiconductor (CMOS) device scaling (e.g., see Hu Chenming et al., U.S. Pat. No. 6,413,802 entitled "FinFET transistor structures having a double gate channel extending vertically from a substrate and methods of manufacture").

The fabrication of a FinFET is generally simpler than most other double-gate structures, although the channel thickness control is problematic in most known approaches (e.g., see U.S. Pat. No. 6,413,802; Yang-Kyu Choi et al., "Spacer FinFET: nanoscale double-gate CMOS technology for the terabit era", Solid-State Electronics, 46, p. 1595, (2002)).

To increase the device current drive, high carrier mobility is required. MOSFETs with high carrier mobility are made by fabricating the device on strained silicon (e.g., see K. Rim et al. "Fabrication and Analysis of Deep Submicron Strained-Si N-MOSFET's", IEEE Trans. Electron Devices, 47(7), p. 1406, (2000)).

The conventional techniques for making strained silicon are applicable for planar devices such as the conventional MOSFET. Examples for such techniques are a graded buffer SiGe layer (e.g., see P. M. Mooney, Materials Science and Engineering Reports R17, p. 105 (1996) and references cited therein), and the relaxation by ion implantation and anneal (e.g., see U.S. Pat. No. 6,593,625 by S. H. Christiansen et al., entitled "Relaxed SiGe layers on Si or silicon on insulator substrates by ion implantation and thermal annealing").

Unfortunately, the FinFET is a non-planar device, where the plane of current conduction (i.e., the Fin) is perpendicular to the wafer surface. This makes the FinFET non-compatible with conventional strain silicon fabrication techniques.

SUMMARY OF THE INVENTION

In view of the foregoing and other exemplary problems, drawbacks, and disadvantages of the conventional methods and structures, an exemplary feature of the present invention is to provide a method (and resulting structure) for fabricating a FinFET with a strained-silicon channel.

In a first exemplary aspect of the invention, a FinFET structure with a strained-silicon channel is disclosed.

The FinFET strained-silicon channel is defect-free and has a uniform thickness, since it is fabricated, preferably by silicon epitaxy and not by etching the fin as in the conventional techniques. The FinFET preferably has two electrically separated gates. The first gate and second gate can be of different materials. The gate dielectric of the first and of the second gate can also be made of different materials and may have different insulator thicknesses.

In a second exemplary aspect of the present invention, a method for fabricating a strained-silicon channel FinFET is disclosed. The straining of the FinFET silicon channel relies on elastic relaxation of free-standing SiGe bars. The elastic relaxation of the SiGe bars circumvents the introduction of defect(s) which are characteristic of "plastic relaxation."

For purposes of this application, "plastic relaxation" or "plastic strain relaxation" means strain relaxation by the introduction of crystal defects.

Plastic strain relaxation results in a rough surface that exhibits a cross-hatch pattern, which raises surface roughness/topography issues as described below. The plastically relaxed film have a typical threading dislocation density in the range of $10^5$-$10^8$ cm$^{-2}$ in the upper part of the relaxed SiGe layer and the strained Si film which is grown over the relaxed SiGe layer. The strain fields from the misfit dislocation network introduce a so-called "mosaic structure" in the SiGe and Si layers. The mosaic structure can be detected by x-ray diffraction analysis as a broadening of the x-ray rocking curve. Triple-axis x-ray diffraction measurements can distinguish mosaic broadening from other effects, such as a non-uniform SiGe lattice parameter or alloy composition, that can also cause a broadening of the x-ray rocking curve. The exact nature of the mosaic structure in the upper part of the SiGe film and the strained Si layer is determined by the arrangement of the misfit dislocations, which will vary depending on the SiGe layer structure and the epitaxial growth conditions used to fabricate the structure.

Thus, the conventional techniques for making strained silicon films primarily rely on plastic relaxation of SiGe and thus introduce defect formation. In contrast, the invention employs elastic relaxation and thus produces a structure substantially defect-free.

The free-standing elastically relaxed SiGe bars are fixed to the substrate and strained silicon is epitaxially grown over the sidewall of the SiGe bars. The epitaxial silicon grows strained since it is deposited on a crystal template of a relaxed SiGe film.

Moreover, the epitaxial layer which forms the device Fin is very uniform. A first gate dielectric and a first gate conductor are deposited. Then, the structure is planarized and the epitaxal silicon film over the top portion of the SiGe bar is removed.

The SiGe bars are etched selectively and replaced by a second gate dielectric and a second gate conductor. The gates are then defined by conventional lithography and reactive ion etching. A sidewall spacer is formed and the device source and drain are implanted.

A self-aligned silicide step and metalization to the device four terminals are then carried out to complete the fabrication of the FinFET.

In another exemplary aspect, a method of forming a semiconductor device (and the resulting structure) includes forming a strained-silicon channel adjacent a source and a drain, forming a first gate over a first side of the channel, forming a second gate over a second side of the channel, forming a first gate dielectric between the first gate and the strained-silicon channel, and forming a second gate dielectric between the second gate and the strained-silicon channel. The strained-silicon channel is non-planar.

In a further exemplary embodiment of the present invention, a method of forming a semiconductor device, includes providing a semiconductor substrate including a buried oxide (BOX), a silicon-on-insulator (SOI) film formed on the BOX, and a strained SiGe film formed on the SOI, etching a cavity into the strained SiGe film and the SOI film, filling said cavity with a filling material to form a pedestal, patterning the strained SiGe film and the SOI film, etching selectively the SOI with respect to the pedestal and the SiGe film to form a free-standing SiGe structure, relaxing the strained SiGe to form a relaxed SiGe, fixing the relaxed SiGe to the substrate; and epitaxially depositing a strained silicon film over the relaxed SiGe film.

In yet another exemplary embodiment of the present invention, a semiconductor device, includes a strained-silicon channel formed adjacent a source and a drain, a first gate formed over a first side of the channel, a second gate formed over a second side of the channel, a first gate dielectric formed between the first gate and the strained-silicon channel, and a second gate dielectric formed between the second gate and the strained-silicon channel. The strained-silicon channel comprises a fin.

In a further exemplary embodiment of the present invention, a method of forming a semiconductor device, includes providing a semiconductor substrate including a buried oxide (BOX), and a relaxed semiconductor film formed on the BOX, patterning the semiconductor film, epitaxially depositing a strained silicon film over the relaxed semiconductor film, depositing a first dielectric film over the strained silicon film, depositing a first gate conductor over the first dielectric film, etching the relaxed semiconductor film, depositing a second dielectric film over the strained silicon film; and depositing a second gate conductor over the second dielectric film.

With the unique and unobvious aspects of the present invention, a strained-channel can be formed which is defect-free since the strain in the channel is obtained by elastic deformation of the film.

Further, the strained-silicon channel thickness is very uniform.

Additionally, the two gates are electrically separated, thus making the FinFET a four terminal device.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Referring now to the drawings, and more particularly to FIGS. 1-24, there are shown exemplary embodiments of the method and structures according to the present invention.

Exemplary Embodiments

Figure 1:
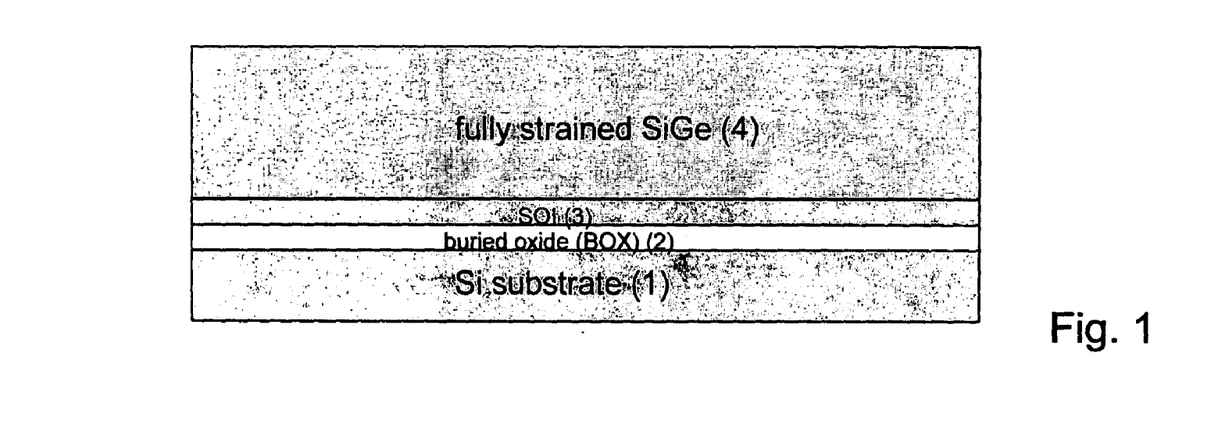
FIG. 1 illustrates a cross-sectional schematic of a silicon-on-insulator (SOI) wafer on which a fully strained SiGe film 4 is epitaxially grown.

Turning to FIG. 1, FIG. 1 shows a silicon-on-insulator (SOI) substrate including a substrate 1, a buried oxide (BOX) 2 and a relatively thin SOI film 3. The buried oxide 2 may be any oxide (e.g., $SiO_2$, etc.) material and acts as a stop etch layer, as described below. It is noted that the relatively thin SOI layer 3 is not necessarily limited to any thickness since it is a sacrificial layer, and thus can be selected based upon the designer's processing conveniences.

Then, a fully strained SiGe layer 4 is epitaxially grown on the SOI film 3. Since the SiGe layer 4 is "fully strained," there are no defects formed therein (e.g., substantially defect-free) since the in-plane lattice constant of the SiGe 4 is matched to that of the SOI 3. Thus, the lattice mismatch between the SiGe film 4 and the SOI 3 is fully accommodated by strain in the SiGe 4 layer without any relaxation.

As an example, if the Ge concentration is chosen to be about 20%, then the SiGe layer 4 can be grown to about 300 nm thick, without any substantial relaxation.

Figure 2:
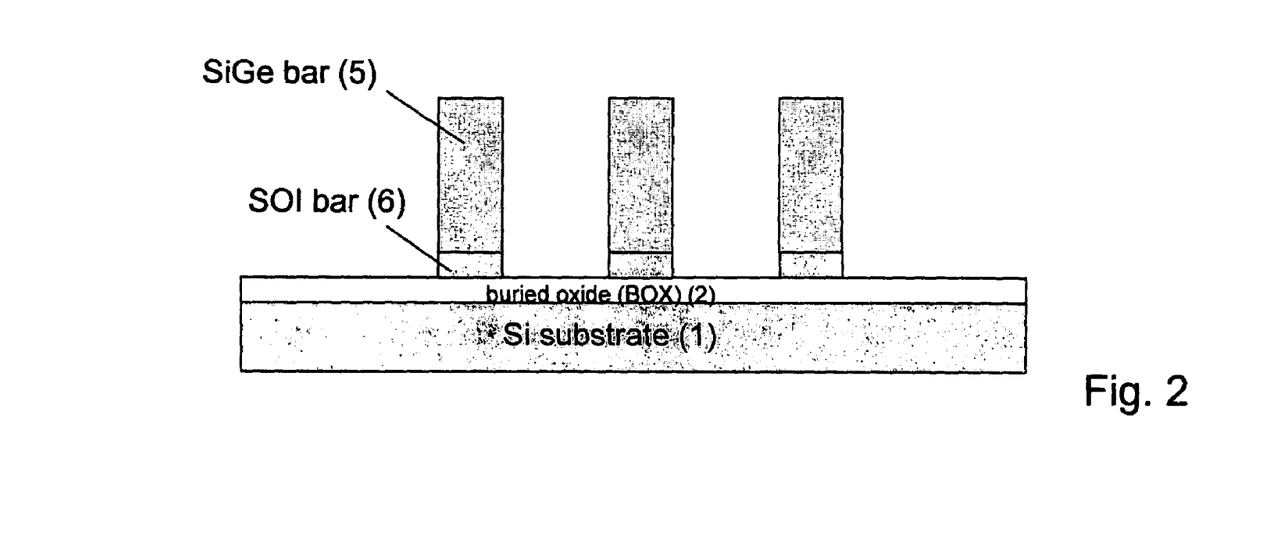
FIG. 2 illustrates the structure after the etching of SiGe bars 5 and the etching of Si bars 6.

Then, a patterning step of the SiGe 4 and SOI 3 layers is performed in FIG. 2. That is, as shown in FIG. 2, the SiGe 4 and SOI 3 films are etched into bars 5 and 6. The etching is typically performed by reactive ion etching (RIE) or the like, with a chemistry selective to silicon dioxide. The etch stops on the buried oxide layer 2, and thus the BOX layer functions as a stop etch. An example of an etch chemistry that is highly selective to oxide is HBr (Hydrogen bromide) chemistry. For this chemistry, an etch selectivity higher than 100:1 is easily obtained when etching Si or SiGe with respect to silicon dioxide.

The width of a bar 5 is preferably about 10 times or more the thickness of the device fin (e.g., the fin will be formed later by epitaxy). Typically, as mentioned above, one of the major disadvantages of conventional techniques of forming a FinFET is that the fin should be made extremely thin. Typically, if a gate is employed having a length of L, then the fin should have a thickness of L/2. Hence, for a 50-nm gate, then a fin having a thickness of 25 nm should be employed. This is very difficult to do conventionally, as current lithography techniques used in manufacturing cannot define a hard mask for a feature size of 25 nm. Hence, in conventional lithography, typically wider masks are defined (e.g., about 75 nm to form a "fat" fin), and then thinning of the fin is performed, such as by oxidation and stripping, or by etching, thereby leaving a fin having a nonuniform thickness. This is very disadvantageous. In contrast, one of the exemplary aims of the invention is to obtain a very thin fin having a well-controlled, uniform thickness.

However, notwithstanding the above, it is noted that the bars 5/6 are not the fin of the inventive FinFET device.

Further, it is noted that there is not necessarily any special relationship between the thickness of the SOI 3 (e.g., thickness of bar 6) and the SiGe 4 (e.g., bar 5). As alluded to above, there is no engineering advantage to having a thin or a thick SOI layer, and it could be any value depending upon the designer's desires.

Figure 3:
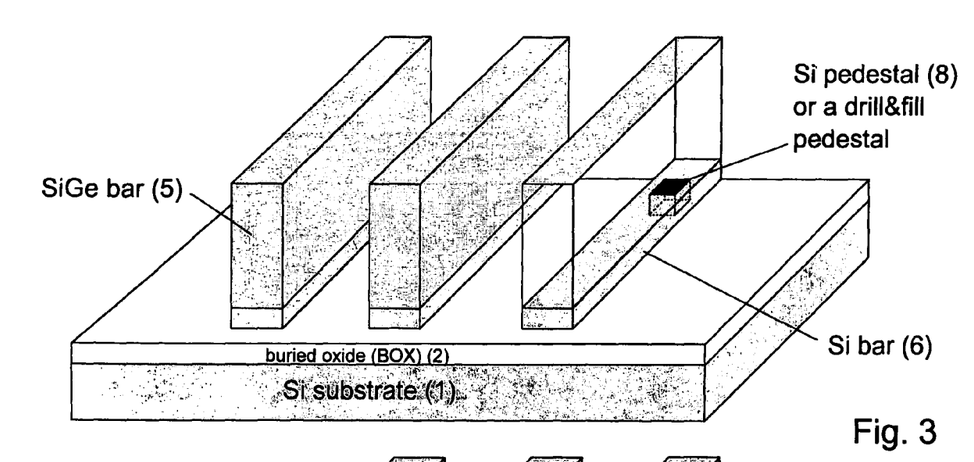
FIG. 3 shows a three-dimensional view of the structure after formation of the SiGe and Si bars 5, 6, respectively, and also shows the embedded "drill and fill" pedestal 8 in the SiGe and Si bars.

Thereafter, as shown in FIG. 3, a pedestal 8 is formed by drilling a hole through the SiGe 4 and SOI 3 films and filling the hole with a material that is not etched by the silicon etchant.

Figure 4:
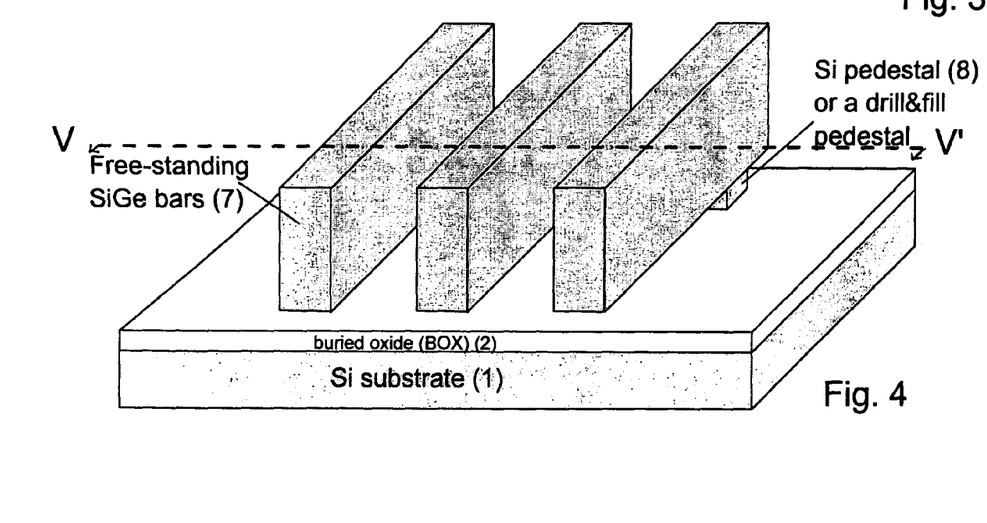
FIG. 4 shows a three-dimensional view of the structure after the etch of the Si bar 6.

While the pedestal 8 is not shown in the cross-sectional view of FIG. 1, the pedestal 8 can be seen in the three-dimensional illustrations of FIGS. 3-4. In contrast to forming the hole through the SiGe 4 and the SOI layer 3, the pedestal 8 could also be formed only in the SOI film 3, prior to the deposition of the SiGe film 4. In another method, the pedestal could be formed of silicon, and defined by p+ doping which makes the doped area resistant to the silicon etching.

As shown in FIG. 3, each of the bars contains one pedestal 8. It is further noted that the pedestal can be a relatively long one (e.g., through both the SOI and the SiGe layers 5, 6) or a relatively short one (e.g., only through the SOI layer 6), depending upon the designer's desires.

Then, as shown in FIG. 4 (and FIG. 5 which is a cross-sectional view of the structure of FIG. 4 along arrows V-V'; it is noted that the cross-sectional cut in FIG. 4 is made at a portion of the bar 7 where the relaxation occurs; there will be no relaxation in the portion of the bar 7 where the pedestal 8 is adjacent and which is therefore an used area), the silicon bar 6 under the SiGe bar 5 is etched selectively with respect to SiGe, the pedestal material 8, and the oxide.

Figure 5:
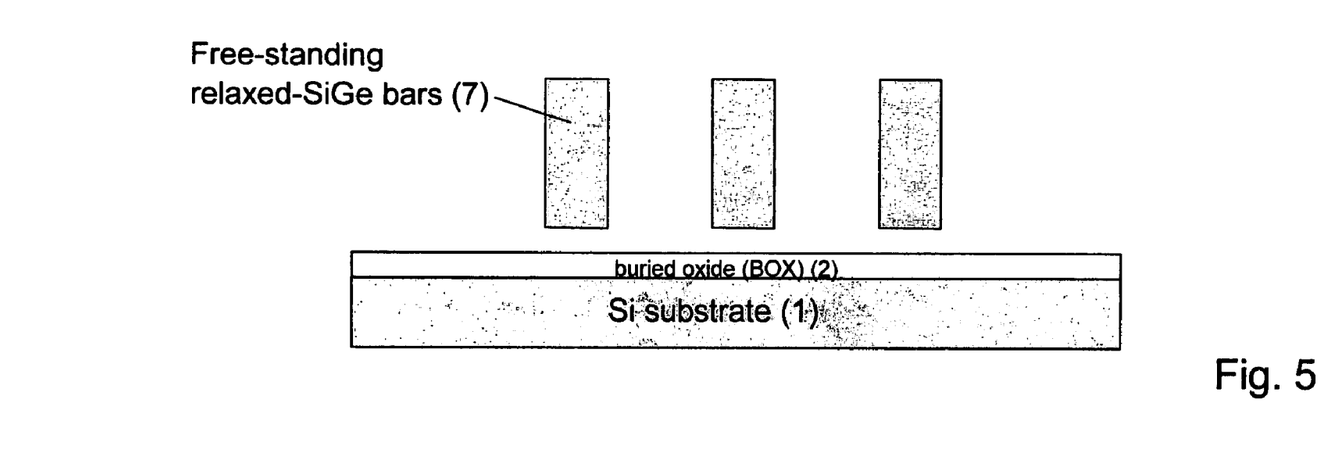
FIG. 5 illustrates a cross-sectional schematic of the structure following the etch of the Si bar 6.

An example of a silicon etchant that is selective to SiGe, p-type silicon and silicon dioxide is TMAH (Tetramethylammonium Hydroxide). The Si etch forms a free-standing SiGe bar 7 which is supported by the pedestal 8.

As shown in FIG. 4, since the SiGe bar 7 is no longer being firmly held by the Si bar 6, it relaxes its strain elastically and assumes its bulk lattice constant. Again, since "elastic relaxation" of the SiGe material takes place, no defects are formed in the SiGe layer during the relaxation.

Figure 6:
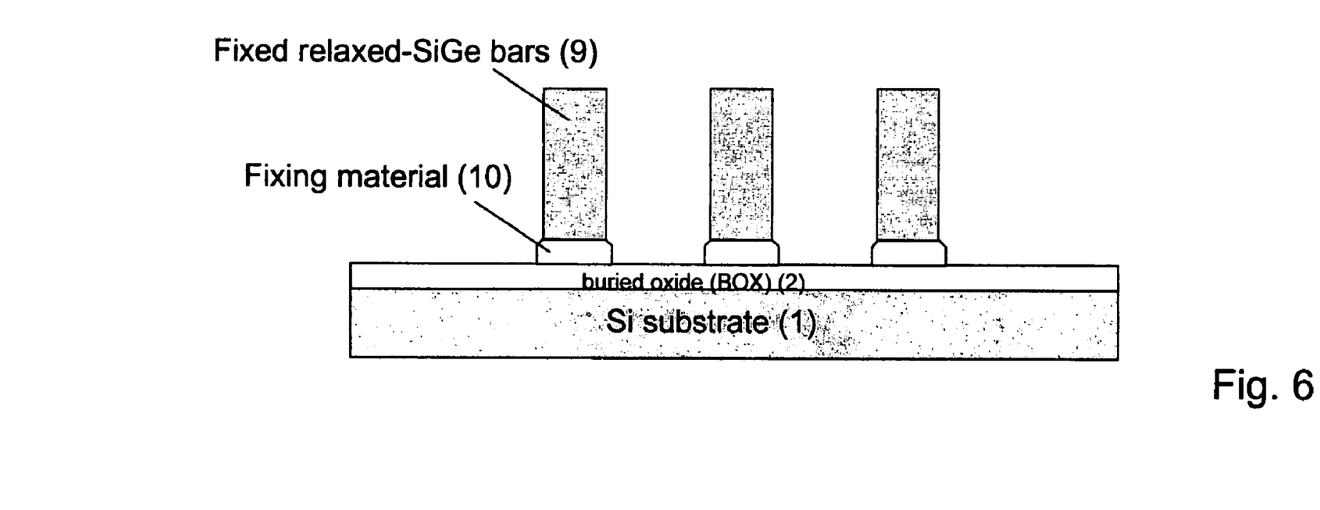
FIG. 6 illustrates a cross-sectional view of the structure after the relaxed free-standing SiGe bars 7 are attached to the substrate with a fixing material 10.

As shown in FIG. 6, a fixing material 10 is used to attach the relaxed free-standing SiGe bar 7 to the substrate. Such an attachment can be performed by depositing a film such as silicon nitride, $SiO_2$ or the like with a thickness preferably larger than half of the gap height between the SiGe bar 7 and the BOX 2.

A key point in the exemplary embodiment is that the SiGe bar 7 being attached to the substrate is fully relaxed. This requires the fixing material not to induce strain in the SiGe bar as it attaches it to the substrate.

In a different embodiment, the fixing material is chosen such that it will induce strain in the relaxed SiGe bar. The sign of the induced strain is chosen such that "over-relaxation" of the SiGe bar is obtained. The over-relaxation leads into more straining of the silicon layer that is epitaxially grown over the SiGe bar.

The film 10 is then removed by etching (e.g., a reactive ion etching (RIE)) except from where it fills the gap between the SiGe bar 9 and the BOX 2. An optional wet etch touch-up can be used to clean the SiGe bar 9 sidewalls.

Figure 7:
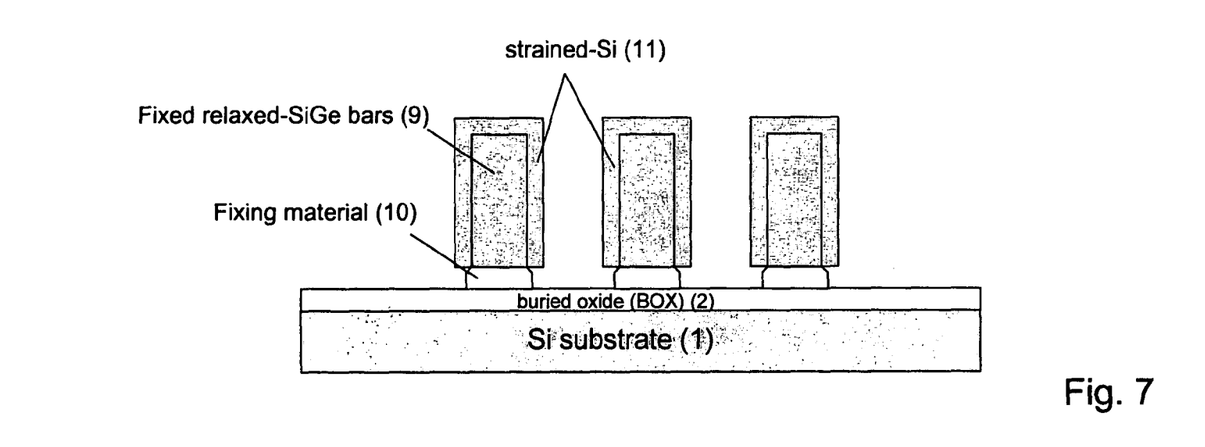
FIG. 7 illustrates the structure following the epitaxial growth of a strained silicon film 11.

As shown in FIG. 7, a strained silicon film 11 is epitaxially grown over the fixed-relaxed SiGe bar 9. The epitaxial silicon layer 11 grows strained since it matches the relaxed SiGe template. The thickness of the Si film 11 is the thickness of the device fin.

Thus, the strained Si film 11 on the sidewalls of the relaxed SiGe bars 9 will become the fin in subsequent processing, as described in further detail below. The thickness of the strained Si film 11 is uniform due to the epitaxial growth of the strained Si film 11, and can be grown to any desired thickness and does not require any lithography (or etching) to define the layer 11. Hence, the invention provides the strained silicon as the fin, and achieves uniformity of the strained silicon channel due to the epitaxial growth, thereby allowing good, accurate control of the thickness of the strained silicon channel.

It is noted that the thickness of bar 9 preferably should be about 10 times or more than that of the fin due to "strain sharing". That is, the thicker the bar 9 is, the less strain sharing will occur. Hence, preferably for a ratio about 10 or larger, there will be substantially no strain sharing. If the approximate 10 ratio is adhered to, the relaxation in the SiGe will be kept to about 90%, and for all practical purposes a strained silicon will be achieved.

Figure 8:
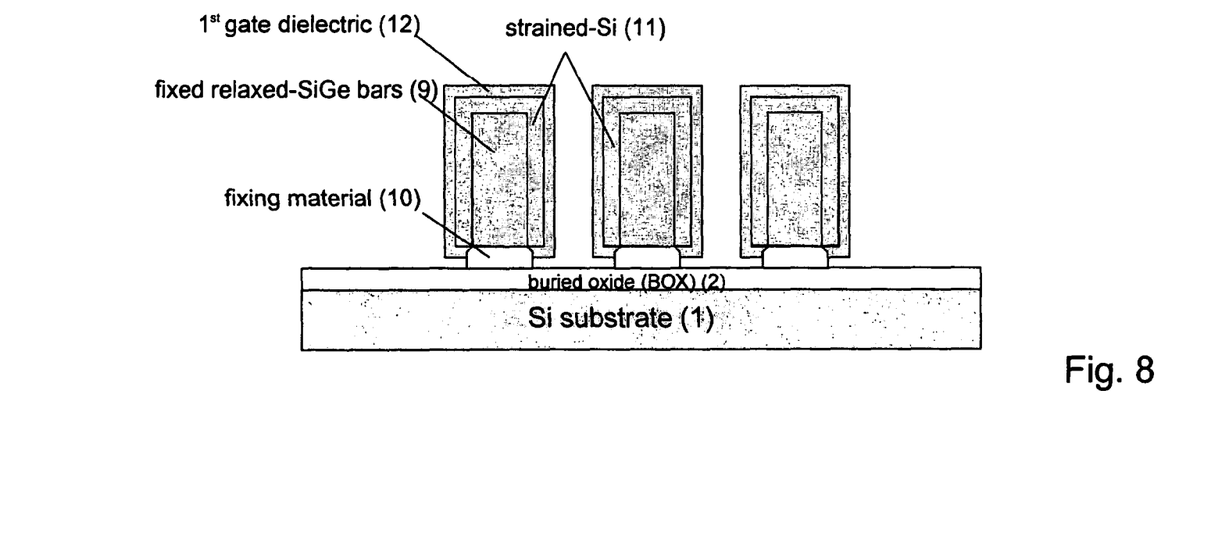
FIG. 8 illustrates the structure after the deposition of a first gate dielectric 12.

Turning now to FIG. 8, a first gate dielectric 12 is deposited (e.g., using high K dielectrics) or grown (e.g., a thermal oxide) over the strained silicon film 11.

Figure 9:
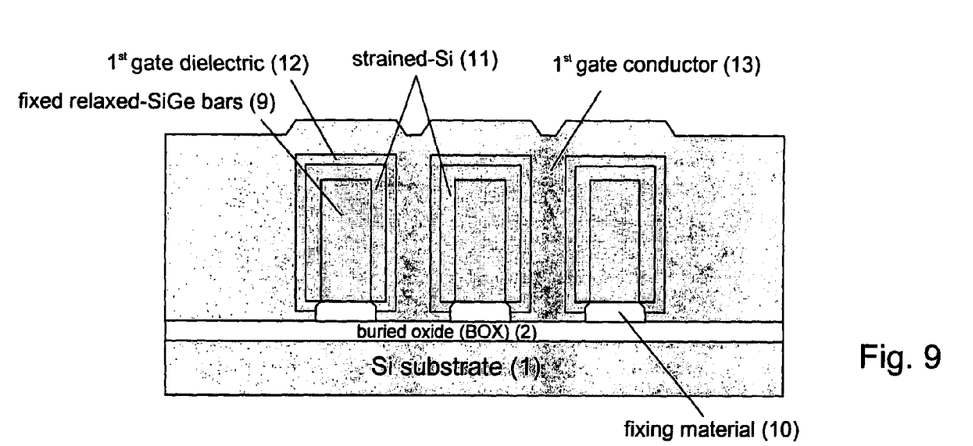
FIG. 9 illustrates the structure after the deposition of a first gate conductor 13.

Then, as shown in FIG. 9, a first gate conductor 13 is deposited over the structure. The gate conductor may be any suitable material such as metal, polysilicon, etc.

Figure 10:
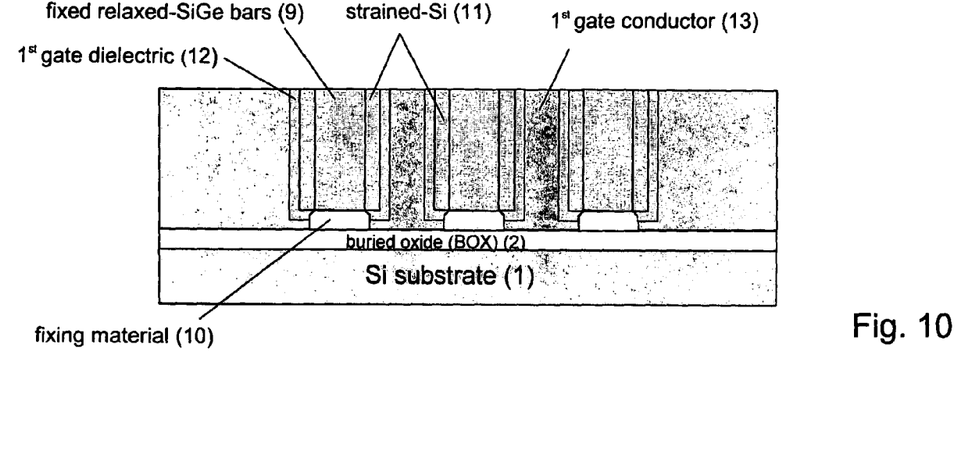
FIG. 10 illustrates the structure after planarization by, for example, chemical mechanical polishing (CMP)

Thereafter, the wafer is planarized by, for example, chemical mechanical polishing (CMP), as shown in FIG. 10, to remove the upper portion of the bar 9 and the top portion of the strained silicon layer 11. Thus, following the CMP, the top portion of the bar 9 is not topped by the gate conductor 13 and the top of the SiGe 9 is exposed. Thus, at the conclusion of the processing of FIG. 10, the strained silicon remains on the sides of the bar 9.

It is noted that the removal of the top portion of the strain silicon layer 11 need not be performed solely by CMP. That is, planarization could be performed, followed by an etching of the remaining gate conductor until the first gate oxide 12 is exposed. Then, a selective etch is used to remove the top portion of the first gate dielectric 12, followed by another selective etch for removing the top portion of the strained silicon layer 11. The combined CMP and etching process allows for a tighter control of Fin's height.

Figure 11:
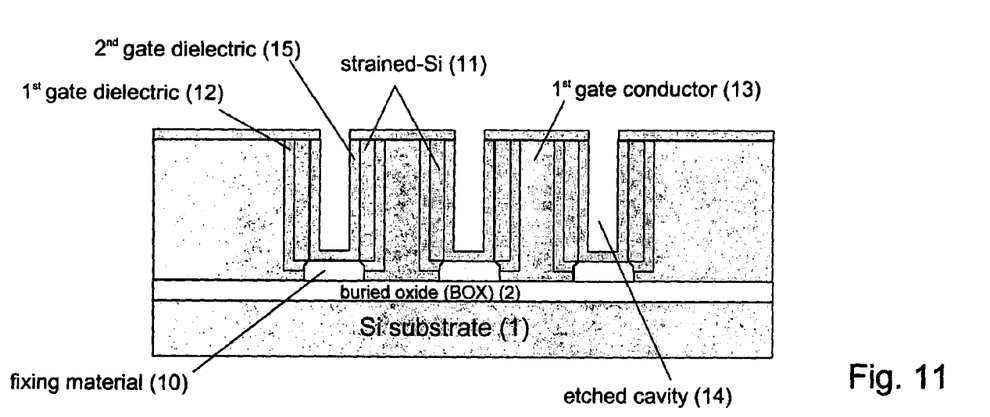
FIG. 11 illustrates the structure after the etching of the relaxed SiGe bars 9 and a deposition of a second gate dielectric 15.

In FIG. 11, the SiGe bar 9 is etched out by a selective wet etch, and a second gate dielectric 15 is conformally deposited over the structure. An example of a SiGe selective wet etch is $1HF:2H_2O_2:3CH_3COOH$. It is noted that the strained silicon film 11 does not relax when the SiGe bar 9 is removed, since it is held firmly in place by the first gate conductor material 13 (and to a lesser degree by the first gate dielectric 12).

The second gate dielectric 15 may be made of the same material and/or have the same thickness as the first gate dielectric 12, or it may be formed of a different material and/or have a different thickness. For example, it may be advantageous to form the second gate dielectric slightly thicker than the first gate dielectric (e.g., approximately 1.5 to about 2 times thicker) when the function of the second gate is for threshold control. The thicker gate dielectric results in a lower capacitance and less gate leakage current. By the same token, if a different material (e.g., a high K dielectric) is used in the second gate dielectric, then typically a different thickness may be desirable since the dielectric material will have a different dielectric constant from that of the material of the first gate dielectric.

Figure 12:
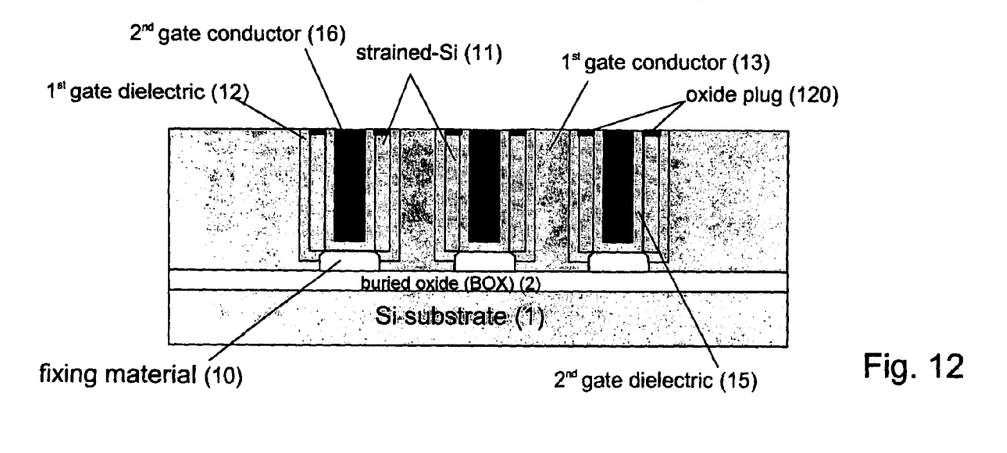
FIG. 12 illustrates the structure after a deposition of a second gate conductor 16, and planarization, for example, by CMP.

In FIG. 12, a second gate conductor 16 is deposited, and the structure is planarized by CMP. Again, the gate conductor may be metal, polysilicon, etc. Thus, as shown in the cross-section of FIG. 12, a strained silicon fin is formed with first and second surfaces of the fin having a gate dielectric and a gate conductor, thereby forming a double-gate device.

Oxide plugs 120 are optionally formed over the strained silicon 11. The oxide plugs 120 protect the source and drain from etching during the gate over-etch step.

It is noted that using plugs 120 may not be required since the etch rate of the fin is much smaller than that of large open areas. To form the oxide plugs 120, preferably the top portion of the strained silicon 11 is slightly recessed by a selective etch, then a dielectric film such as oxide is deposited over the structure and the structure is planarized by CMP.

Figure 13:
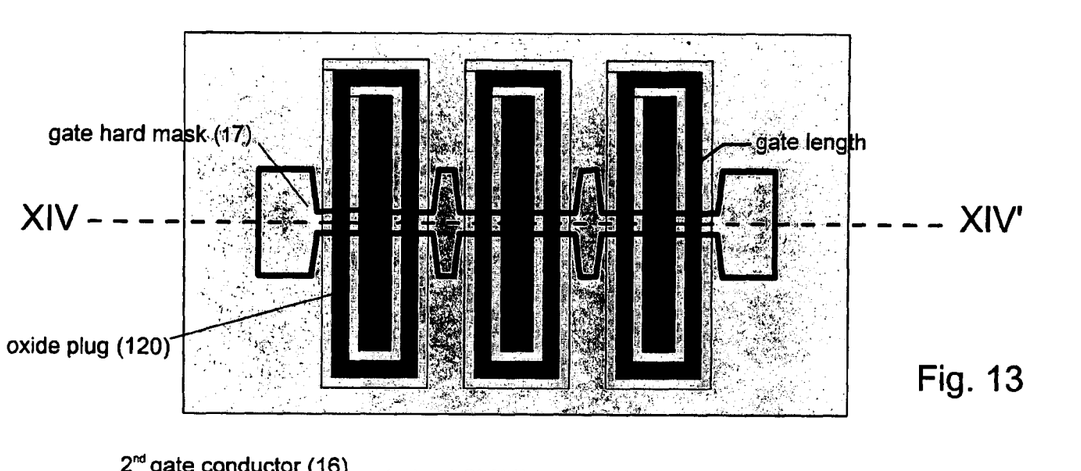
FIG. 13 illustrates a top view of the structure after the definition of a hard mask 17.
Figure 14:
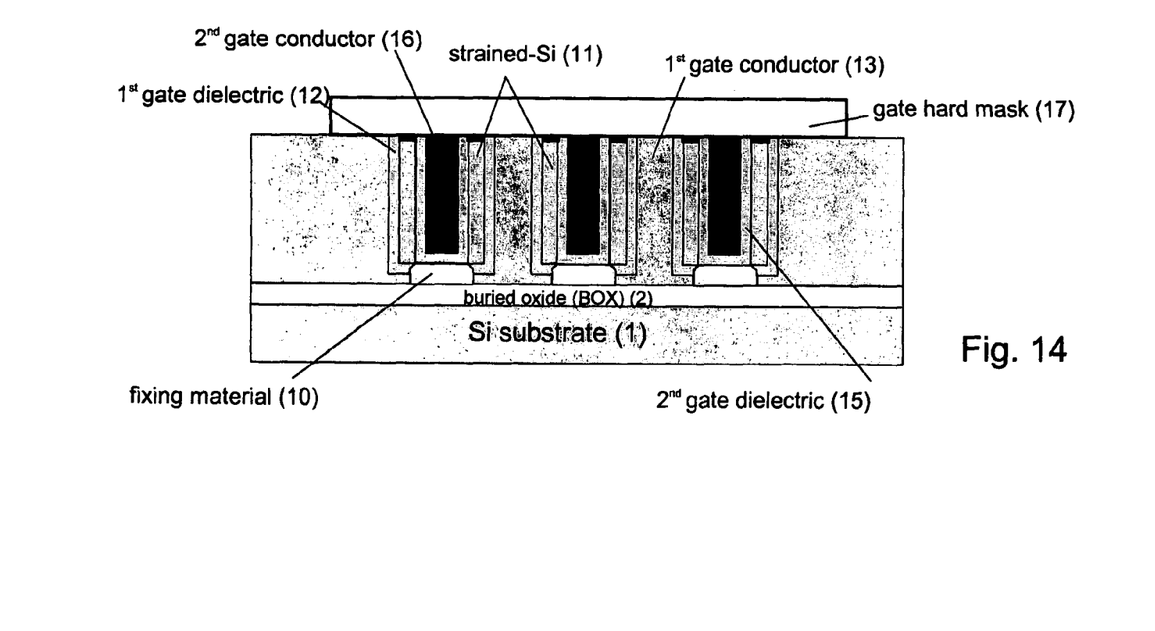
FIG. 14 illustrates a cross-sectional view of the structure after the definition of the hard mask 17.

As shown in FIGS. 13 and 14, a hard mask 17 for gate etch (e.g., defining the gate length) is deposited and patterned. FIG. 13 is a top view of the structure, whereas FIG. 14 represents a view along arrows XIV-XIV' in FIG. 13. The mask defines the FinFET gates length as shown by the arrow. The FinFET gates are self-aligned since both gates are defined by a single mask 17.

Figure 15:
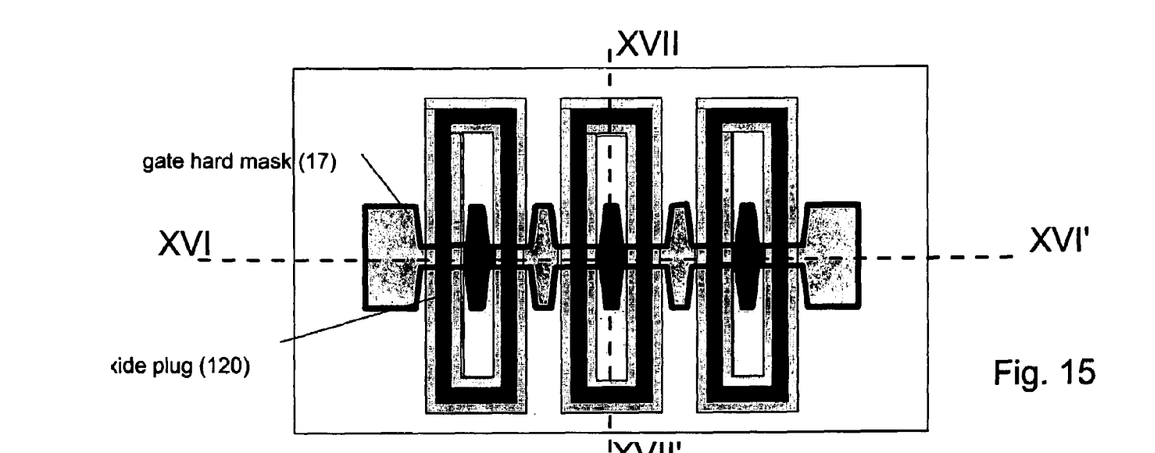
FIG. 15 (e.g., showing a top view) and FIGS. 16 and 17 (e.g., showing two main cross-sectional views) illustrate the structure after the etch of the first and second gates 13, 16.
Figure 16:
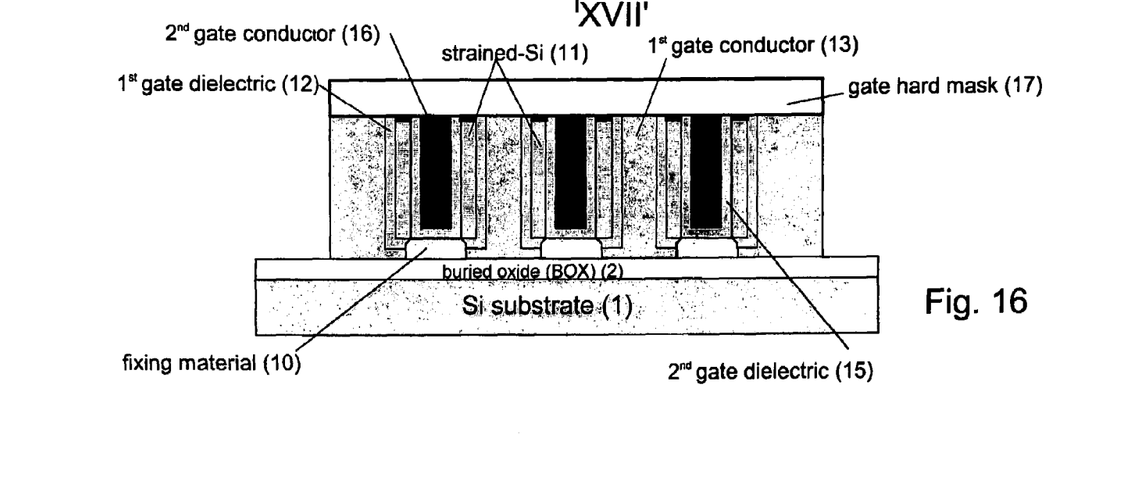
Figure 17:
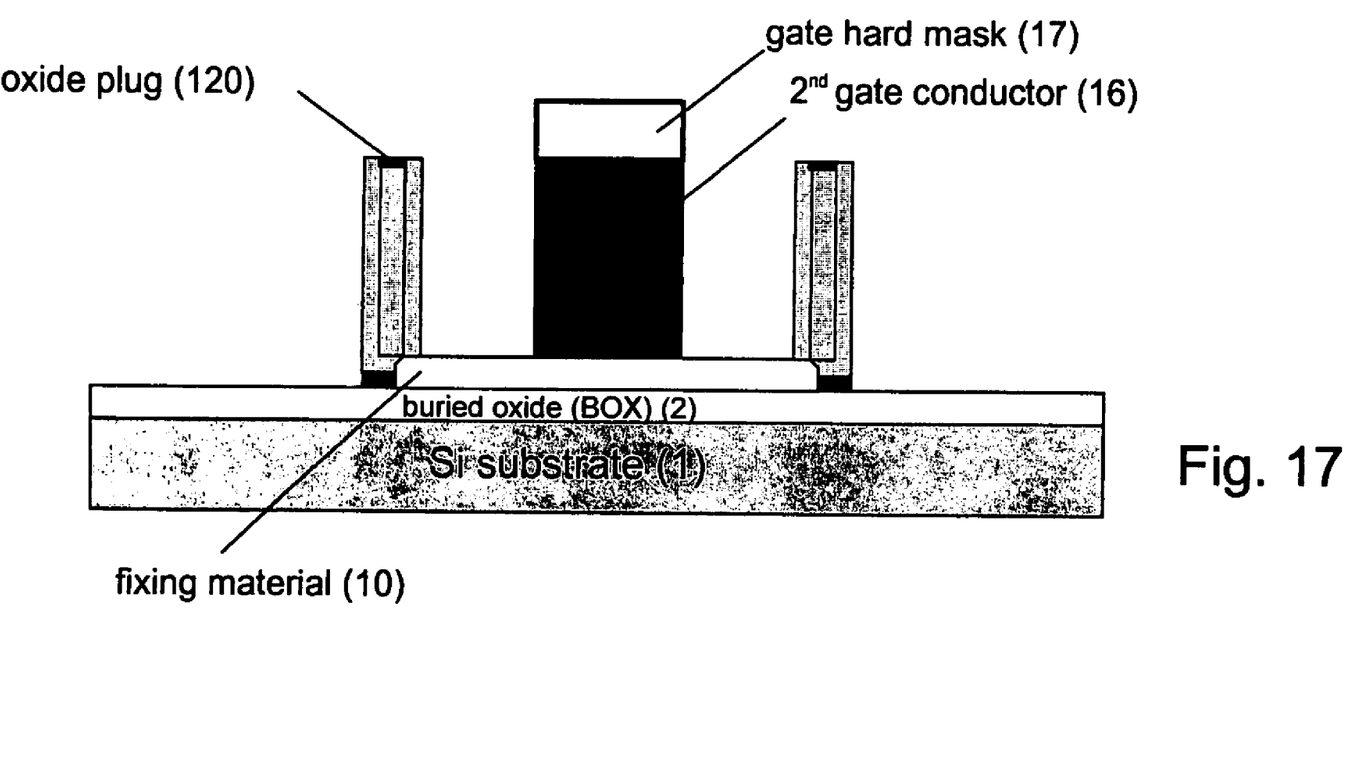

Next, the gate materials 13 and 16, that are not protected by the hard mask 17, are etched, for example, by RIE, as shown in FIGS. 15-17 (e.g., FIGS. 15, 16, and 17, respectively, show a top view, and the two main cross-sections of the device). It is noted that, as mentioned above, in forming the bar height, several aspects should be considered. First, the SiGe layer cannot be made extremely thick (tall), otherwise it will begin to relax. Secondly, if the SiGe material is too thick, then it will be difficult to etch the gate material. Thus, a tendency is not to make the SiGe too tall/thick, otherwise it is difficult to etch the gate material from sidewalls.

Thus, in the top view of FIG. 15 (and the cross-sectional view shown in FIG. 16 which is a view taken along arrows XVI-XVI' in FIG. 15), the gate is etched.

In the top view of FIG. 15 (and the cross-sectional view shown in FIG. 17 which is a view taken along arrows XVII-XVII' in FIG. 15), which also shows that the gate is etched. FIG. 17 shows the device after etching, not where the channel is as in FIG. 16, but where the gate fans out to form a contact pad.

Figure 18:
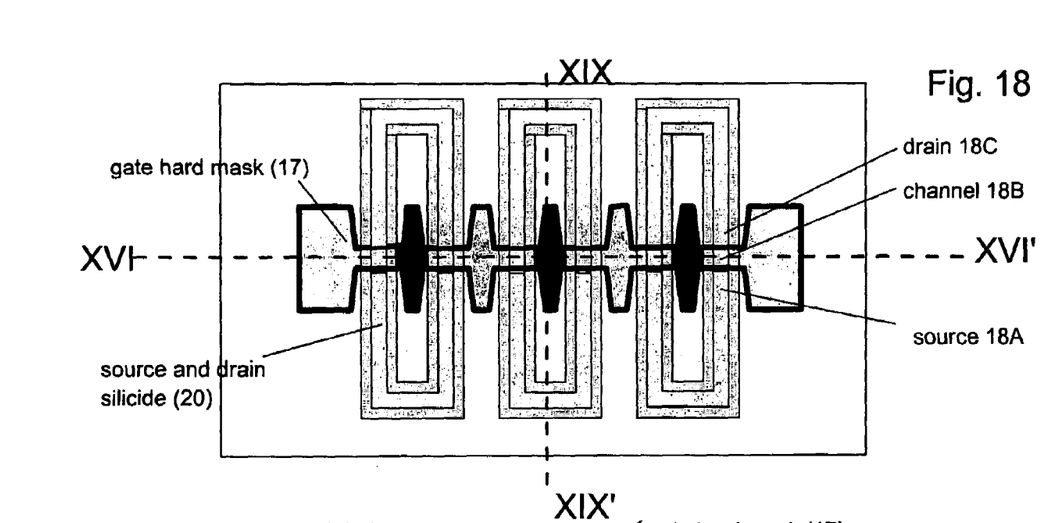
FIG. 18 (e.g., showing a top view) and FIG. 19 (e.g., showing a cross-sectional view) illustrate the structure after the formation of a sidewall spacer 19, and the formation of silicide 20.
Figure 19:
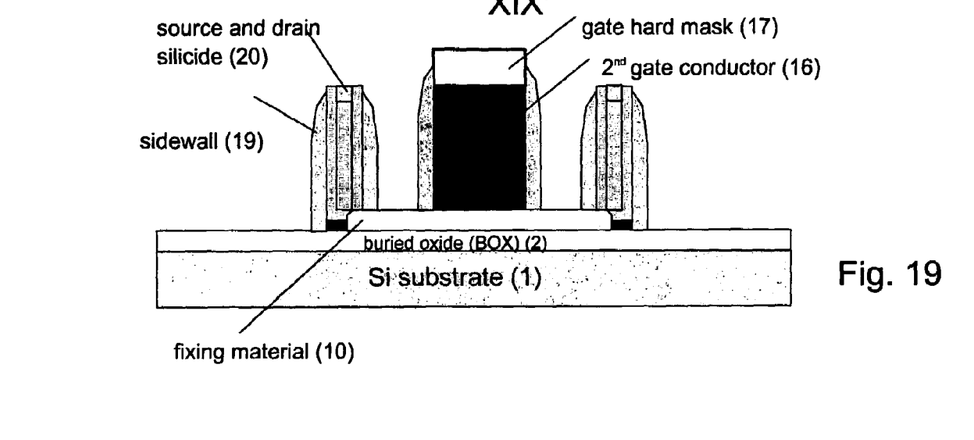

In FIGS. 18 and 19 (which shows a view along arrows XIX-XIX' in FIG. 18), a sidewall spacer 19 is formed, and a source 18A and drain 18C are implanted and annealed to activate the dopants. Thus, FIG. 18 shows the source 18A, channel 18B, and drain 18C regions of the device. It is noted that the implant preferably is a blanket implant.

After the implant, the oxide plugs 120 are removed and the top portion of the source 18A and drain 18B are salicided 20 by a self-aligned silicide (salicide) process.

If the gate material is polysilicon, then the hard-mask 17 can be etched prior to the salicide step to allow the silicide to form over the gate.

Figure 20:
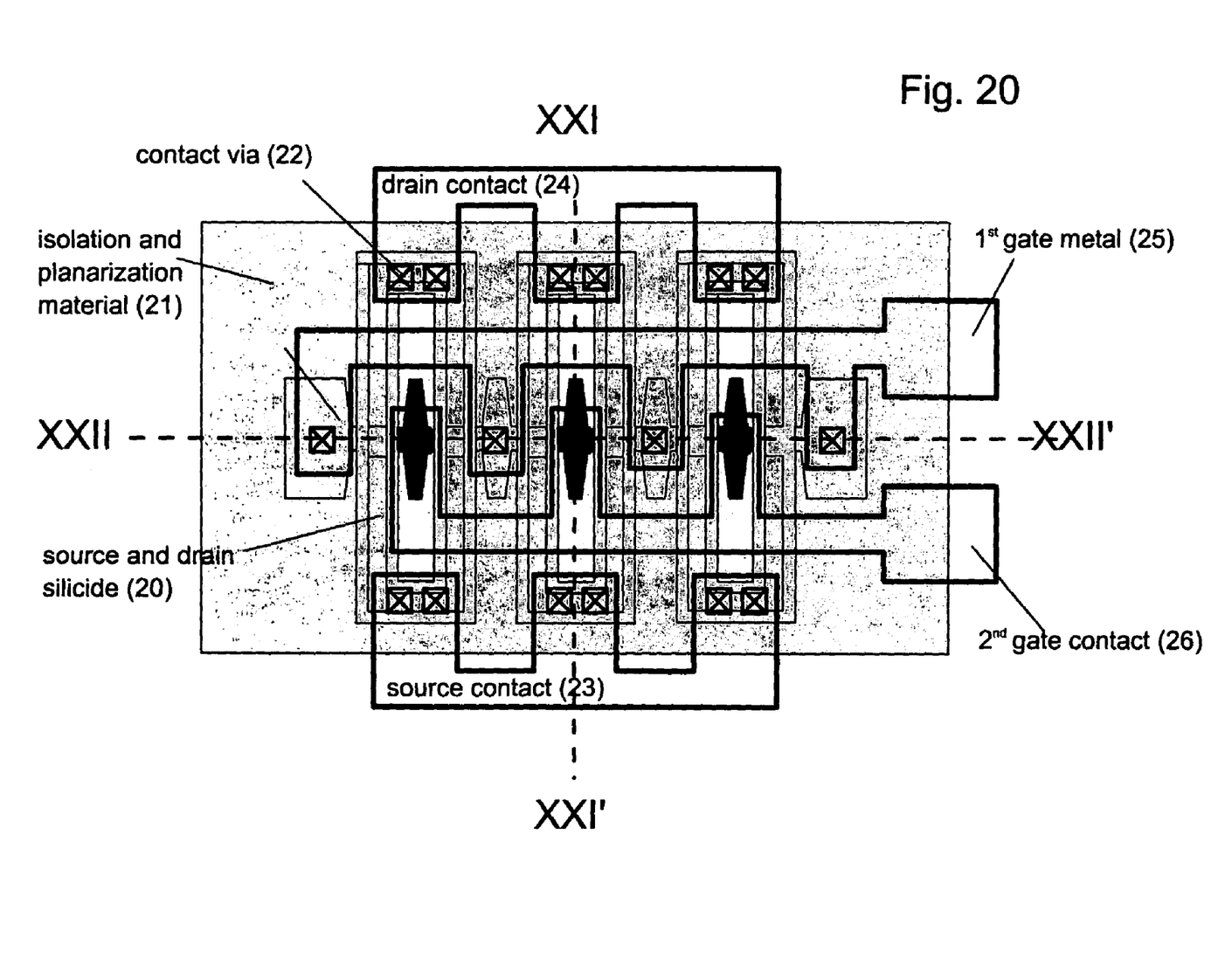
FIG. 20 (e.g., showing a top view) and FIGS. 21 and 22 (e.g., showing two main cross-sectional views) illustrate the structure after forming contact vias 22 and metal contacts 23, 24, 25, 26 to the source, drain and the two gates.
Figure 21:
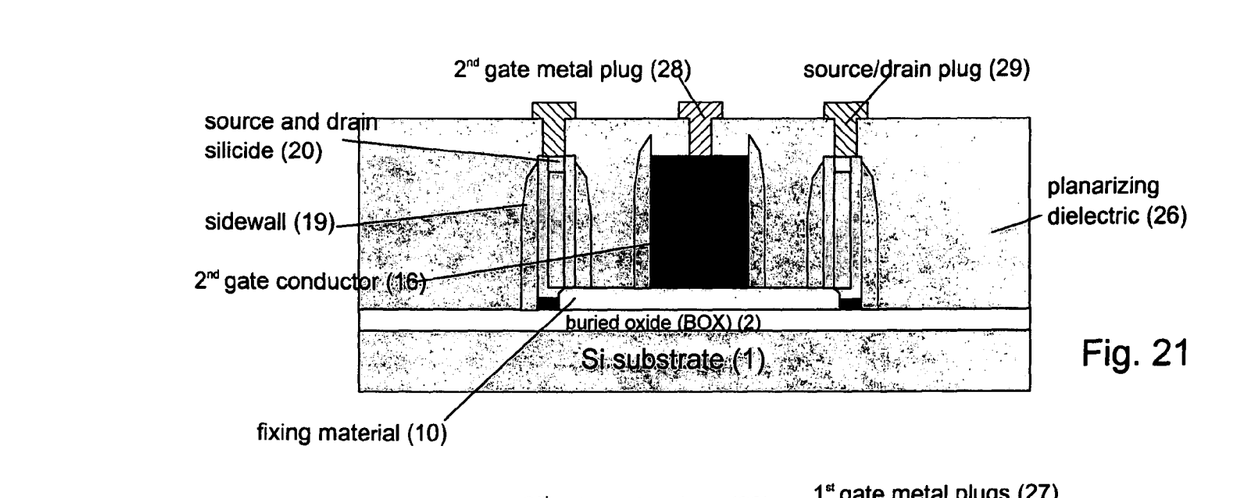
Figure 22:
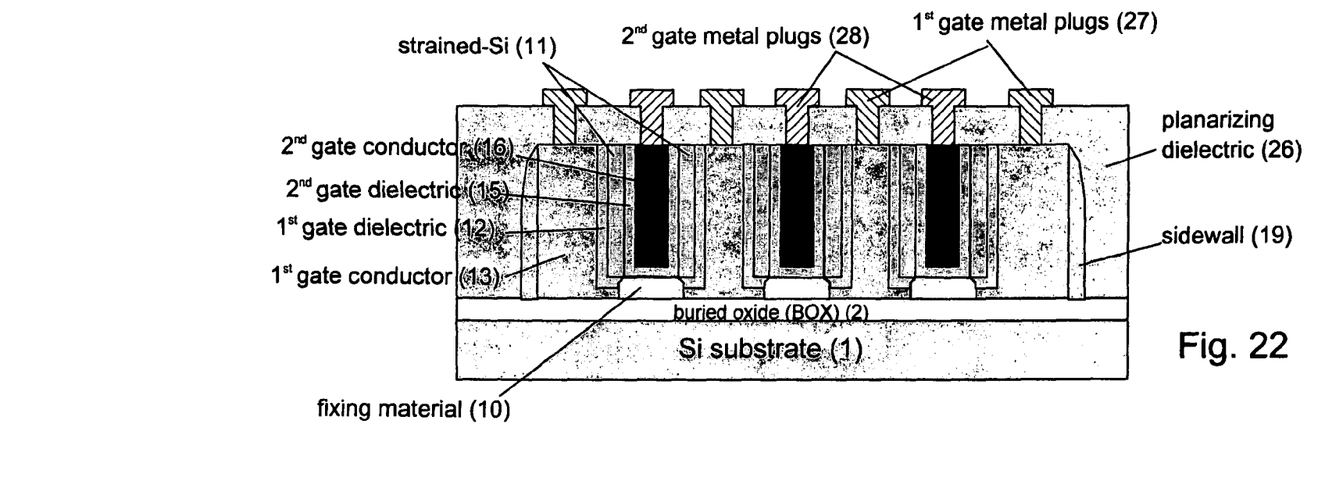

In FIGS. 20-22 (FIG. 21 being a view along arrows XXI-XXI' in FIG. 20 and FIG. 22 being a view along arrows XXII-XXII' in FIG. 20), an isolation and planarization material 21 (e.g., an insulator such as silicon dioxide) is deposited over the structure.

Then, the structure is planarized by, for example, CMP, and contact vias 22 are opened to the source 18A, the drain 18C, and each of the gates. Then, a metal is deposited and patterned to form the source contact 23, the drain contact 24, the first gate contact 25 and the second gate contact 26.

Figure 23:
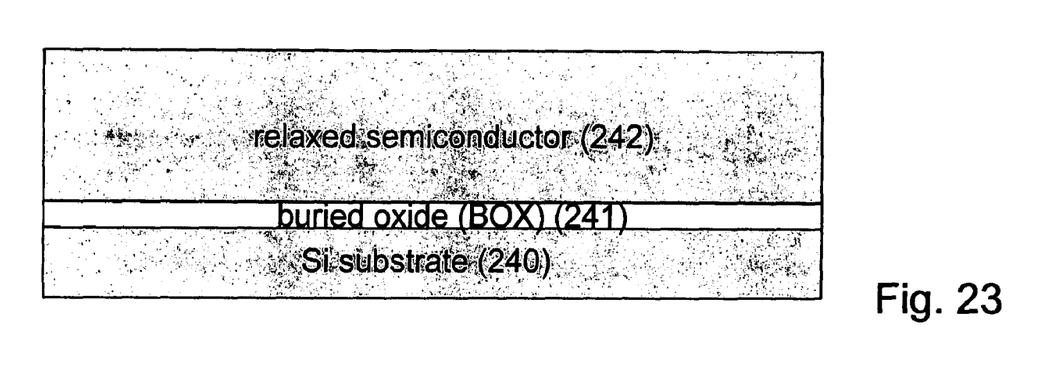
FIGS. 23-24 illustrate processing of another exemplary embodiment according to the present invention.

In a different embodiment shown in FIG. 23, the starting substrate comprises a silicon substrate 240, a buried oxide 241 and a relaxed semiconductor film 242. The relaxed semiconductor film can be formed on the buried oxide 241 by wafer bonding.

In such a method, a donor substrate from which the layer is taken is implanted by, for example, hydrogen, and then flipped and bonded to the receiving wafer (e.g., bonded to the buried oxide 241). The depth of the implanted hydrogen will roughly define the thickness of the transferred layer from the donor wafer. Then, the bonded wafers are annealed.

The annealing provides several advantages. First, it strengthens the bond between the receiving wafer and the donor wafer. Secondly, the implanted hydrogen forms blisters at about the depth of the implant which causes the donor wafer to separate, and leave behind a layer from the donor wafer on the receiving wafer. Examples of bulk donor wafers include Si, Ge, InP, GaAs, GaP, etc.

The above technique is not limited to transfer of layers from bulk wafers. For example, it is possible to transfer a layer of SiGe grown on a bulk Si wafer. In this case, the relaxation of the SiGe film will be achieved by the formation of threading dislocations (i.e., plastic relaxation). This is in contrast to the exemplary embodiment of the present invention, as described above, where relaxation of the SiGe film was achieved by elastic relaxation.

If one is only trying to achieve a very uniform fin as the present invention provides, but does not require a strained fin, then layer 242 can be a pseudomorphically grown SiGe (i.e., fully strained), or even a doped silicon film. The use of SiGe or doped silicon for making the bars on which sidewalls the fins are epitaxially grown provides a mechanism for selectively etching the bars with respect to silicon.

Figure 24:
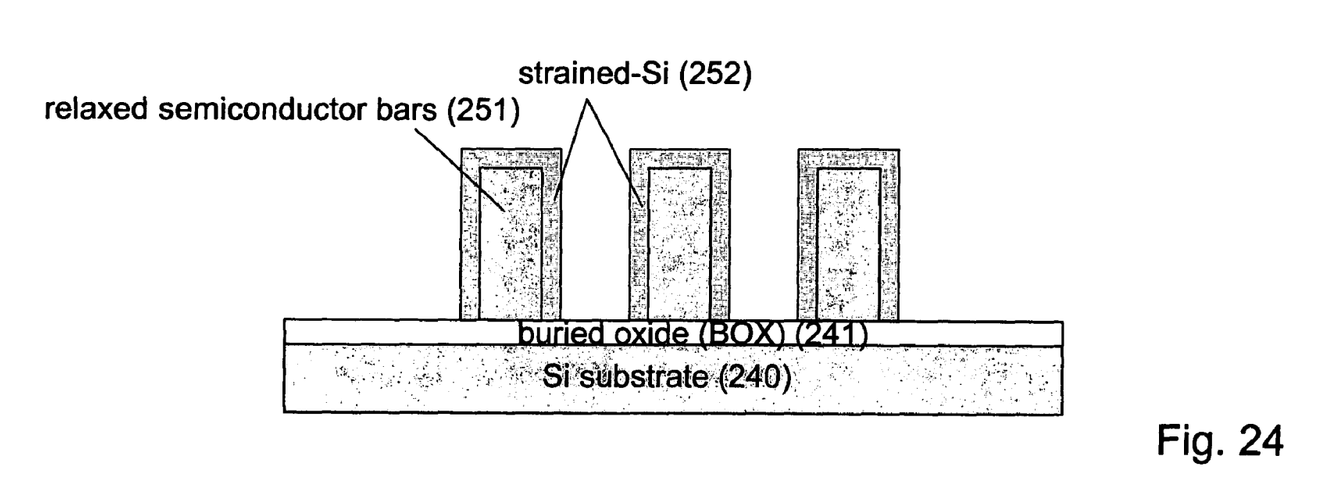

Referring to FIG. 24, the relaxed semiconductor film is etched into bars 251, and a strained silicon film 252, which will form the fin, is epitaxially grown on the bar's sidewalls. It is noted that, since layer 242 is already relaxed, there is no need to form the free-standing structure or the pedestal, as in the above exemplary embodiment. Also, there is no need to use a fixing material. The remaining process steps are identical to those discussed in the exemplary embodiment above.

Along with the above structures, the invention can incorporate such devices and structures into a circuit.

With the unique and unobvious exemplary aspects of the present invention, a fin of a FinFET device can be formed of strained silicon 11 (e.g., defect-free since it was obtained by elastic deformation of the film) which has been epitaxially grown.

Secondly, a very uniform channel is achieved due to the epitaxial growth of the strained silicon 11.

Thirdly, a device having two electrically-separated gates is achieved, thereby making the FinFET a four terminal device.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

For example, it is noted that the invention does not rely on the bars 9 being vertical as shown, for example, in FIG. 2 in combination with FIG. 7, which shows the formation of the strained silicon. Indeed, the bar may be sloped (e.g., have a shape other than a rectangular cross-section, such as a trapezoid, etc.) or have a sloped sidewall during an etching process or another process. In such a case, there will be no effect on the advantages of the invention.

That is, there will be no mitigation on the effects of the invention since the bar 9 is sacrificial and will be removed, and all that will be left is what was grown epitaxially as the strained channel. In such a case, the fact that the strained channel may have a slope (e.g., be other than perpendicular to the surface of the substrate) is not problematic and has no effect on the functionality and performance of the device. The strained channel would still have a uniform thickness since the channel was formed epitaxially.

What is claimed is:

1. A double-gate field effect transistor, comprising:
   a strained-silicon channel formed adjacent a source and a drain on a substrate, said strained-silicon channel comprising two separated portions, wherein each of said two separated portions of said strained-silicon channel connects said source and said drain;
   a first gate formed over a first vertical outer side of said strained-silicon channel;
   a second gate formed over a second vertical inner side of said strained-silicon channel located between said two separated portions of said strained-silicon channel;
   a first gate dielectric formed between said first gate and said strained-silicon channel; and
   a second gate dielectric formed between said second gate and said strained-silicon channel,
   wherein said strained-silicon channel is non-planar, said first gate comprises at least one chemical element not included in said second gate, said first gate dielectric is chemically different than said second gate dielectric.

2. The double-gate field effect transistor of claim 1, wherein said strained-silicon channel thickness is substantially uniform.

3. The double-gate field effect transistor of claim 1, wherein said strained-silicon channel thickness is set by epitaxial growth.

4. The double-gate field effect transistor of claim 1, wherein said strained-silicon channel is substantially defect-free.

5. The double-gate field effect transistor of claim 1, wherein said strained-silicon channel includes a distorted lattice cell.

6. The double-gate field effect transistor of claim 1, wherein said first gate and said second gate are independently controllable.

7. The double-gate field effect transistor of claim 1, wherein said first gate and said second gate are self-aligned.

8. The double-gate field effect transistor of claim 1, wherein said first gate and said second gate are defined in a single lithographic step.

9. The double-gate field effect transistor of claim 1, wherein said first gate, said second gate, said source and said drain are self-aligned with respect to each other.

10. The double-gate field effect transistor of claim 1, wherein said strained-silicon channel comprising a plurality of fins.

11. A circuit, comprising:
    the double-gate field effect transistor of claim 1.

12. The double-gate field effect transistor of claim 1, wherein said strained-silicon channel is tensely strained.

13. The double-gate field effect transistor of claim 1, wherein said strained-silicon channel is compressively strained.

14. The double-gate field effect transistor of claim 1, wherein the first gate is electrically separated from the second gate.

15. The double-gate field effect transistor of claim 1, wherein strain in said strained-silicon channel was elastically induced by a sacrificial stressor.

16. The double-gate field effect transistor of claim 1, wherein said strained-silicon channel is controlled by said first gate and by said second gate.

17. The double-gate field effect transistor according to claim 1, wherein said first gate and said second gate are separated from one another.

18. The double-gate field effect transistor according to claim 1, wherein carriers in said channel are controlled by said first gate and said second gate.

19. The double-gate field effect transistor according to claim 1, wherein said strained-silicon channel comprises first vertical outer side covered by said first gate dielectric and second vertical inner side covered by said second gate dielectric.

20. The double-gate field effect transistor according to claim 1, wherein a thickness of said first gate dielectric is independent of a thickness of said second gate dielectric.

21. The double-gate field effect transistor according to claim 1, further comprising a fixing material disposed under said second gate.

22. A double-gate field effect transistor, comprising:
    a strained-silicon channel formed adjacent a source and a drain on a substrate, said strained-silicon channel comprising two separated portions, wherein each of said two separated portions of said strained-silicon channel connects said source and said drain;
    a first gate formed over a first vertical outer side of said strained-silicon channel;
    a second gate formed over a second vertical inner side of said strained-silicon channel located between said two separated portions of said strained-silicon channel;
    a first gate dielectric formed between said first gate and said strained-silicon channel; and
    a second gate dielectric formed between said second gate and said strained-silicon channel,
    wherein said strained-silicon channel comprises fins, said first gate comprises at least one chemical element not included in said second gate, said first gate dielectric is chemically different than said second gate dielectric.

23. The double-gate field effect transistor of claim 22, wherein the first gate is electrically separated from the second gate.

24. The double-sate field effect transistor of claim 22, wherein strain in said strained-silicon channel was elastically induced by a sacrificial stressor.

25. The double-gate field effect transistor of claim 22, wherein said strained-silicon channel is controlled by said first gate and by said second gate.

26. The double-gate field effect transistor according to claim 22, further comprising oxide plugs formed over said fins.

27. A semiconductor device, comprising:

a strained-silicon channel formed adjacent a source and a drain on a substrate, said strained-silicon channel comprising two separated portions, wherein each of said two separated portions of said strained-silicon channel connects said source and said drain;

a first gate formed over a first vertical outer sidewall of said strained-silicon channel;

a second gate formed over a second vertical inner sidewall of said strained-silicon channel located between said two separated portions of said strained-silicon channel;

a first gate dielectric formed between said first gate and said strained-silicon channel; and a second gate dielectric formed between said second gate and said strained-silicon channel, wherein said strained-silicon channel is non-planar, and said first vertical outer sidewall and said second vertical inner sidewall are opposing to each other, said first gate comprises at least one chemical element not included in said second gate, said first gate dielectric is chemically different than said second gate dielectric.

28. A semiconductor device, comprising:

a strained-silicon channel formed adjacent a source and a drain on a substrate, wherein strain in said strained-silicon channel was elastically induced by a sacrificial stressor said strained-silicon channel comprising two separated portions, wherein each of said two separated portions of said strained-silicon channel connects said source and said drain;

a first gate formed over a first vertical outer side of said stained-silicon channel;

a second gate formed over a second vertical inner side of said strained-silicon channel located between said two separated portions of said strained-silicon channel;

a first gate dielectric formed between said first gate and said strained-silicon channel; and a second gate dielectric formed between said second gate and said strained-silicon channel, wherein said strained-silicon channel is non-planar, and is fixed to the substrate by said first and second gates, said first gate comprises at least one chemical element not included in said second gate, said first gate dielectric is chemically different than said second gate dielectric.

* * * * *